United States Patent
Fang et al.

[11] Patent Number: 5,880,030
[45] Date of Patent: Mar. 9, 1999

[54] UNLANDED VIA STRUCTURE AND METHOD FOR MAKING SAME

[75] Inventors: Sychyi Fang, Palo Alto; Chien Chiang, Fremont; David B. Fraser, Danville, all of Calif.

[73] Assignee: Intel Corporation, Santa Clara, Calif.

[21] Appl. No.: 978,105

[22] Filed: Nov. 25, 1997

[51] Int. Cl.$^6$ .................................................. H01L 21/302
[52] U.S. Cl. ...................... 438/701; 438/624; 438/639; 438/978; 438/694
[58] Field of Search ................................. 438/623, 624, 438/637, 639, 640, 978, 694, 701, 713

[56] References Cited

U.S. PATENT DOCUMENTS

| | | | |
|---|---|---|---|
| 4,560,436 | 12/1985 | Bukham et al. ........................ | 156/643 |
| 4,832,788 | 5/1989 | Nemiroff ................................ | 156/643 |
| 5,451,543 | 9/1995 | Woo et al. .............................. | 437/195 |
| 5,702,981 | 12/1997 | Maniar et al. .......................... | 437/192 |
| 5,721,157 | 2/1998 | Sunada ................................... | 437/195 |
| 5,795,820 | 8/1998 | Kepler .................................... | 438/624 |

FOREIGN PATENT DOCUMENTS 315517   9/1997   Taiwan .

OTHER PUBLICATIONS

"Process Margin Analysis of 0.25mum CMOS Unlanded Vias"; Yew et al., abstract only, 1996 Proceedings Thirteenth International VLSI Multilevel Interconnection Conference (VMIC), 1996.

*Primary Examiner*—William Powell
*Assistant Examiner*—George Goudreau
*Attorney, Agent, or Firm*—Raymond J. Werner

[57] ABSTRACT

A high density, low capacitance, interconnect structure for microelectronic devices has unlanded vias formed with organic polymer intralayer dielectric material having substantially vertical sidewalls. A method of producing unlanded vias includes forming a planarized organic polymer intra-layer dielectric between conductors, forming an inorganic dielectric over the conductor and organic polymer layer, patterning a photoresist layer such that openings in the photoresist layer overlap portions of both the conductor and the intra-layer dielectric, etching the inorganic dielectric and then concurrently stripping the photoresist and anisotropically etching the organic polymer intra-layer dielectric. A second conductor is typically deposited into the via opening so as to form an electrical connection to the first conductor. A silicon based insulator containing an organic polymer can alternatively be used to form the intra-layer dielectric.

13 Claims, 7 Drawing Sheets

UNLANDED VIA STRUCTURE AND METHOD FOR MAKING SAME

BACKGROUND OF THE INVENTION

1. Field of the Invention

The present invention relates generally to microelectronic structures and fabrication methods, and more particularly to an unlanded via structure and methods of making the same.

2. Background

Advances in semiconductor manufacturing technology have led to the development of integrated circuits having multiple levels of interconnect. In such an integrated circuit, patterned conductive material on one interconnect level is electrically insulated from patterned conductive material on another interconnect level by films of material such as silicon dioxide. Connections between the conductive material at the various interconnect levels are made by forming openings in the insulating layers and providing an electrically conductive structure such that the patterned conductive material from different interconnect levels are brought into electrical contact with each other. These structures are often referred to contacts or vias.

A consequence of having multiple layers of patterned conductive material separated by an insulating layer is the formation of undesired capacitors. The parasitic capacitance between patterned conductive material, or more simply, interconnects, separated by insulating material on microelectronic devices contributes to effects such as RC delay, power dissipation, and capacitively coupled signals, also known as cross-talk.

One way to reduce the unwanted capacitance between the interconnects is to use an insulating material with a lower dielectric constant. Unfortunately, low dielectric constant materials tend to not have sufficient mechanical strength to support the multi-level interconnect systems typical of complex integrated circuits. A hybrid approach is possible wherein an intra-layer low dielectric constant material is disposed between the interconnect lines and planarized, and then a layer of mechanically stronger but electrically less desirable material is formed as an inter-layer dielectric.

Figure 1:
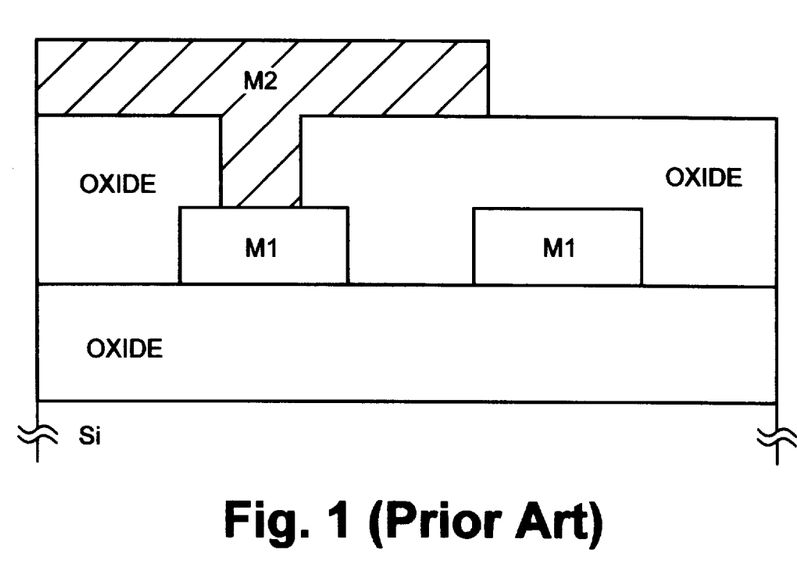
FIG. 1 is a schematic cross-section of a landed via.

Another issue that confronts manufacturers of integrated circuits is that of packing density. One aspect of packing density, often referred to as pitch, is the width of an interconnect line and the space required between those lines. When a via is formed between two interconnect levels it has been required that there be overlap of the opening by the underlying conductive material. In some cases this requires that the minimum width of the underlying conductive material be increased to provide a landing for the via opening. FIG. 1 shows a schematic cross-section of a landed via between metal lines on two different interconnect levels. The increase in minimum width to accommodate the overlap requirement increases the pitch, and correspondingly decreases the packing density.

A way of reducing the pitch is to remove the requirement of having a landed via. That is, unlanded vias offer increased packing density. However, the process of unlanded via formation has proved to be incompatible with the hybrid low-dielectric constant intra-layer material capped with a mechanically stronger inter-layer dielectric.

What is needed is a structure that supports high packing density while simultaneously providing low parasitic capacitance between interconnect layers, and methods of making such a structure.

SUMMARY OF THE INVENTION

Briefly, a high density, low capacitance, interconnect structure for microelectronic devices has unlanded vias formed with an intralayer dielectric material containing organic polymer, wherein the intralayer dielectric material has substantially vertical sidewalls.

In a further aspect of the present invention, a method of producing unlanded vias includes forming a planarized low dielectric constant intra-layer material between conductors, forming an inorganic inter-layer dielectric: (ILD) over the conductor and low dielectric constant intra-layer material, patterning a photoresist layer such that openings in the photoresist layer overlap portions of both the conductor and the intralayer dielectric, etching the inorganic dielectric, and concurrently stripping the photoresist and anisotropically etching the intralayer dielectric containing organic polymer. A second conductor is typically deposited into the via opening so as to form an electrical connection to the first conductor.

DETAILED DESCRIPTION

Terminology

The terms, chip, integrated circuit, monolithic device, semiconductor device, and microelectronic device, are often used interchangeably in this field. The present invention is applicable to all the above as they are generally understood in the field.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, such as aluminum (Al), copper (Cu) an alloy of Al and Cu, an alloy of Al, Cu and silicon (Si), an alloy of Cu and magnesium (Mg), or an alloy of Cu and niobium (Nb), are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal suicides are examples of other conductors.

The terms contact and via, both refer to structures for electrical connection of conductors from different interconnect levels. These terms are sometimes used in the art to describe both an opening in an insulator in which the structure will be completed, and the completed structure itself. For purposes of this disclosure contact and via refer to the completed structure.

The expression, low dielectric constant material, refers to materials having a lower dielectric constant than oxides of silicon. Organic polymers and silicon based insulators containing organic polymers have lower dielectric constants than silicon dioxide.

The term vertical, as used herein, means substantially orthogonal to the surface of a substrate.

Overview

In order to manufacture integrated circuits with small interconnect pitch and low parasitic capacitance between interconnect levels, it is desirable to produce unlanded vias in a hybrid insulator system. Such a hybrid insulator system has a low dielectric constant intra-layer dielectric, such as an organic polymer or a silicon based insulator containing an organic polymer, and an inorganic insulator film, such as oxides or nitrides of silicon, disposed on top of the low dielectric constant intra-layer dielectric. Unlanded vias in accordance with the present invention have substantially vertical sidewalls adjacent to the substantially vertical sidewalls of the low dielectric constant intra-layer material.

A method of producing unlanded vias, in accordance with the present invention, includes forming a planarized organic polymer intra-layer dielectric between conductors, forming an inorganic dielectric over the conductor and organic polymer layer, patterning a photoresist layer such that openings in the photoresist layer overlap portions of both the conductor and the intra-layer dielectric, etching the inorganic dielectric and concurrently stripping the photoresist and anisotropically etching the organic polymer based intra-layer dielectric. A second conductor is typically deposited into the via opening so as to form an electrical connection to the first conductor. An alternative method embodying the present invention uses a silicon based insulator containing an organic polymer, rather than simply using an organic polymer for the low dielectric constant intra-layer dielectric.

Structure

Figure 2:
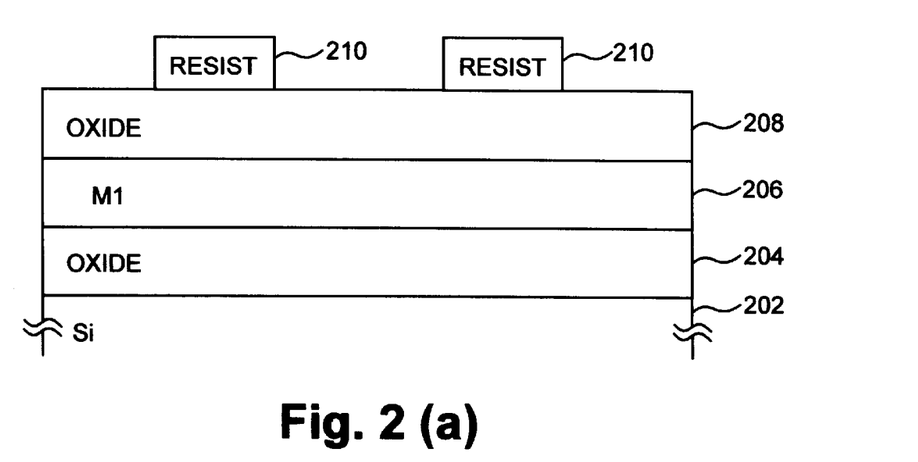
FIGS. 2(a)–2(f) are schematic cross-sections illustrating various stages of fabrication of an unlanded via in accordance with the present invention.

Unlanded vias in accordance with the present invention include organic polymer based intra-layer dielectric material wherein the intra-layer dielectric material has substantially vertical sidewalls. FIGS. 2(f) and 3(f) illustrate unlanded vias in accordance with the present invention.

The unlanded via of FIG. 2(f) includes an oxide cap 208 overlying first conductors 206. By including cap 208 the thickness of the planarized low dielectric constant material is increased so that the fringing fields emanating from the corners of first conductors 206 pass through the low dielectric constant material.

The unlanded via of FIG. 3(f) is similar to that shown in FIG. 2(f) with the exception that oxide cap 208 is not present.

Method

A method of forming unlanded vias in accordance with the present invention is described below in conjunction with FIGS. 2(a)–2(f).

Figure 2C:
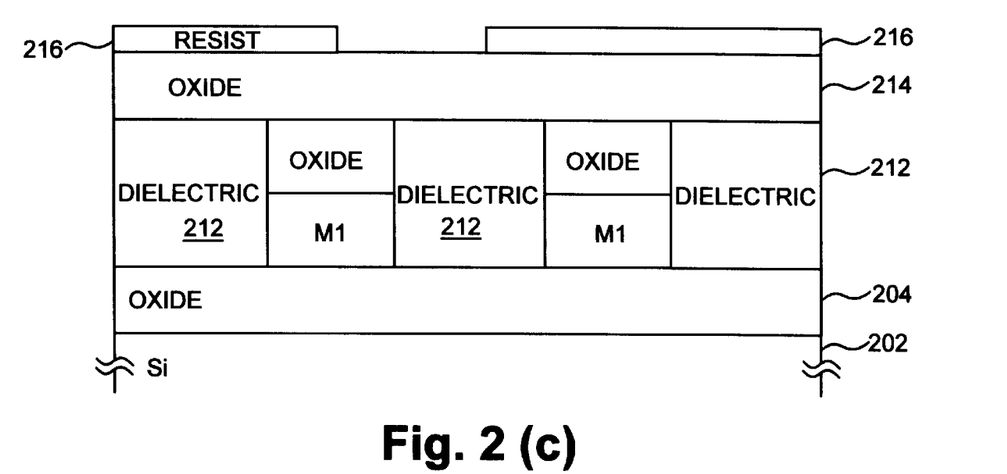
Figure 2D:
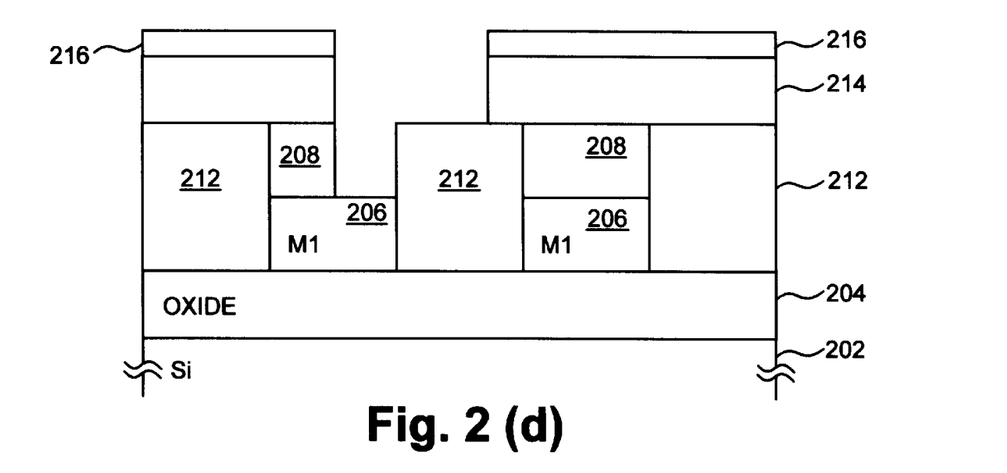

As shown in FIG. 2(a), a metal layer 206 is formed on an insulator 204 which is formed on a substrate 202. Substrate 202 and insulator 204 taken together are referred to herein as an insulating substrate. An oxide film 208, approximately 200 nm thick, of a silicon oxide, is deposited over metal layer 206. In alternative embodiments, oxide film 208 may have a thickness in the range of approximately 10 nm to approximately 500 nm. Typically, this oxide is formed by the plasma enhanced deposition of tetraethylorthosilicate (PTEOS). Those skilled in the art will recognize that other methods of forming an oxide layer are possible such as generating ozone external to the reaction chamber and supplying both ozone and tetraethylorthosilicate so as to react and deposit an oxide layer. Subsequent to oxide 208 deposition, oxide 208 and metal 206 are patterned by means of known photolithographic and etching techniques. Next, as can be seen in FIG. 2(b), an organic polymer film is spun on and pilanarized using a chemical mechanical polishing (CMP) process. Oxide 208 is used as a polish stop. Referring to FIG. 2(c) an ILD 214 is then deposited. ILD 214 may be formed from silicon dioxide, or from a combination of silicon dioxide and silicon nitride. Alternatively ILD 214 may be a fluorine-doped silicon oxide. In the illustrative embodiment of the present invention, ILD 214 is between approximately 0.6 microns and approximately 1.2 microns thick. An unlanded via opening photoresist layer 216 is patterned and then exposed ILD 214, and underlying oxide 208 are etched as shown in FIG. 2(d). An oxygen containing plasma is then used to concurrently strip unlanded via opening photoresist layer 216 and anisotropically etch organic polymer intra-layer dielectric 212 to form organic polymer insulator portion 212a, as shown FIG. 2(e). In the illustrative embodiment of the present invention, etch conditions are approximately 1.5 mTorr and $N_2/O_2$ 45/5 sccm. Alternatively, a hydrogen plasma may be used to achieve substantially the same results, and those skilled in the art having the benefit of this disclosure will appreciate that various combinations of pressure and flow rates may be used. Organic polymer portion 212a has substantially vertical sidewalls. In an alternative embodiment, organic polymer portion 212a is underetched such that a larger amount of organic polymer remains after the etch step.

The via opening is then cleaned and filled. Although, FIG. 2(f) shows a second conductor 218 filling the via and forming a conductor on a second interconnect level, it will be understood by those skilled in the art, that the via opening can be filled with a conductive material that is different from conductor 218. Similarly, the conductor filling the via may be deposited or formed by a process which is different from that which is used to deposit or form conductor 218.

An alternative method of forming unlanded vias in accordance with the present invention is described below in conjunction with FIGS. 3(a)–3(f).

Figure 3:
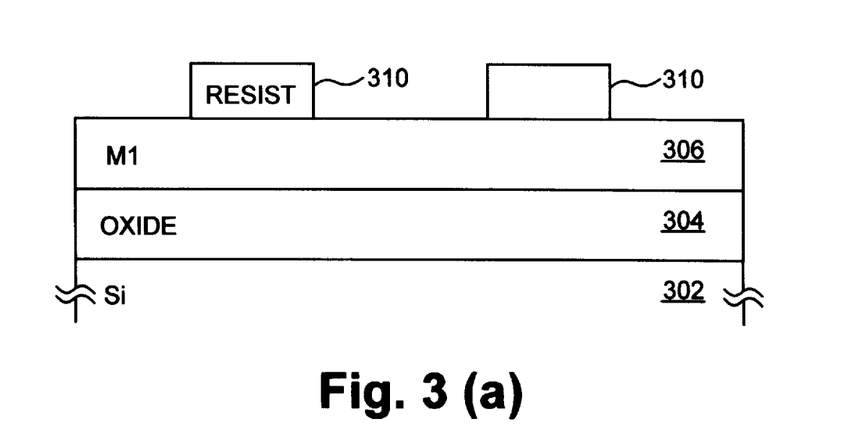
FIGS. 3(a)–3(f) are schematic cross-sections illustrating various stages of fabrication of an alternative unlanded via in accordance with the present invention.
Figure 3C:
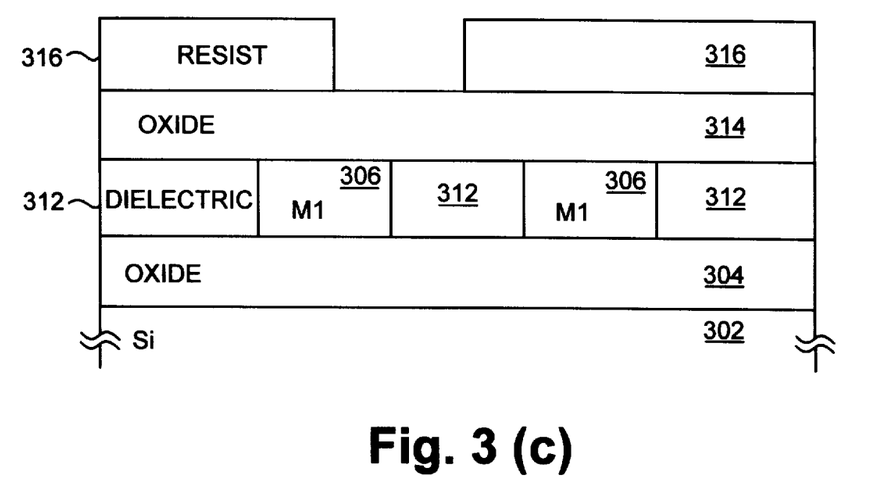
Figure 3D:
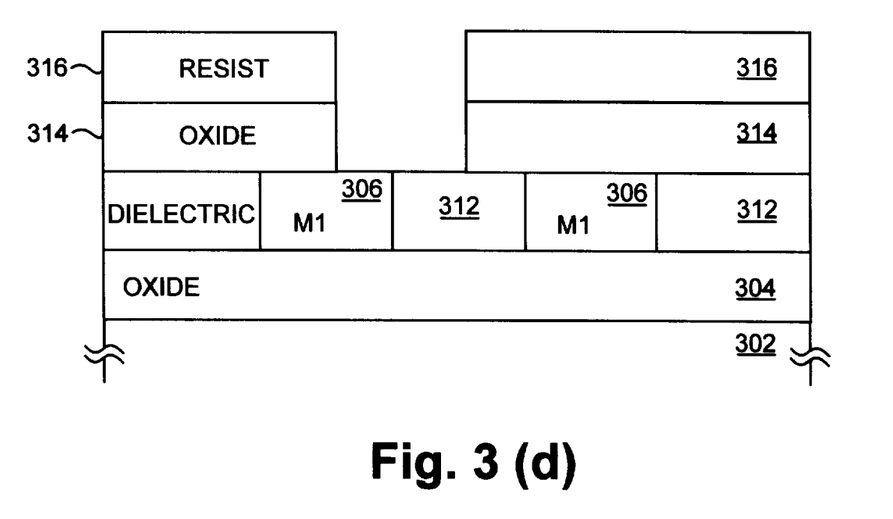
Figure 3E:
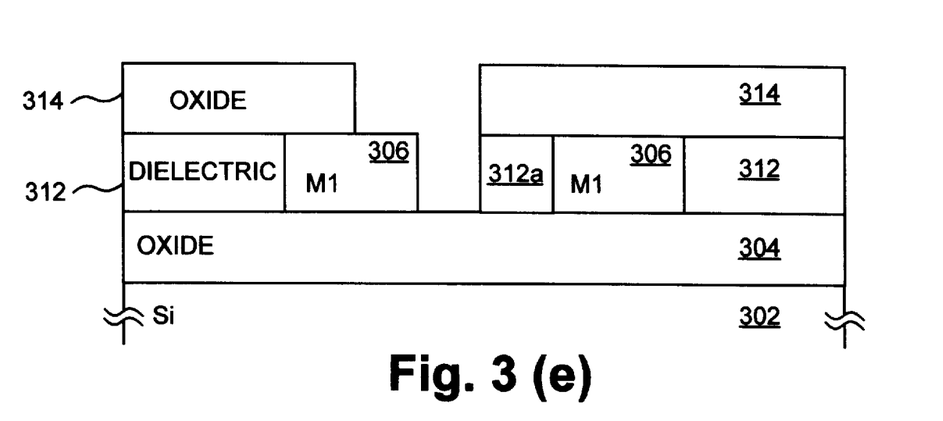
Figure 3F:
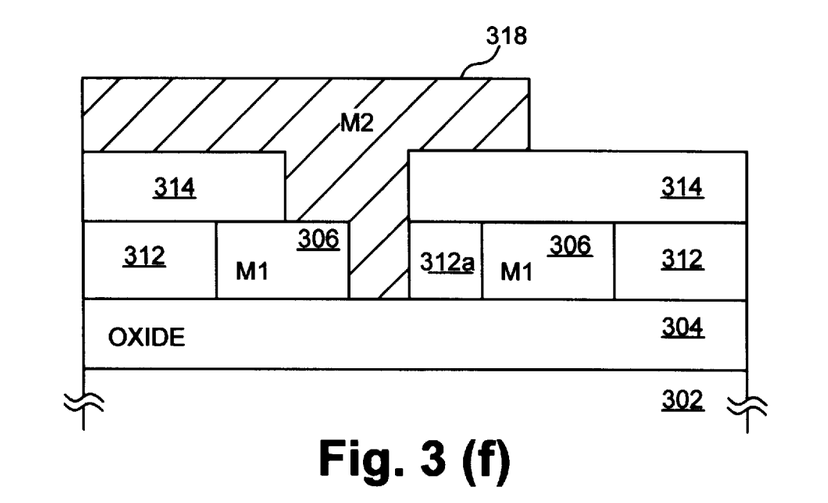

As shown in FIG. 3(a), a metal layer 306 is formed on an insulator 304 which in turn has been formed on a substrate 302. Substrate 302 is typically a silicon wafer and insulator 304 is typically a silicon oxide. Substrate 302 and insulator 304 taken together are referred to herein as an insulating substrate. Subsequent to the metal deposition, metal 306 is patterned by means of known photolithographic and etching techniques. Next, referring to FIG. 3(b), an organic polymer film 312 is spun on and planarized, typically using a chemical mechanical polishing (CMP) process. Alternatively, a plasma etch-back step may be performed, rather than CMP, to achieve planarization. As can be seen in FIG. 3(c), an inorganic material 314, such as silicon oxide, is then deposited as an ILD. An unlanded via opening photoresist layer 316 is patterned and then the exposed ILD is etched as shown in FIG. 3(d). An oxygen containing plasma is then used to concurrently strip the unlanded via opening photoresist layer 316 and anisotropically etch organic polymer intra-layer dielectric 312a. In an alternative embodiment, organic polymer intra-layer dielectric 312a is underetched such that a larger amount of organic polymer remains after the etch step.

The via opening is then cleaned and filled. Although, FIG. 3(f) shows a second conductor 318 filling the via opening and forming a conductor on a second interconnect level, it will be understood by those skilled in the art, that the via opening can be filled, that is plugged, with a conductive material that is different from conductor 318 which overlies inorganic insulator 314. similarly, the conductor filling the via opening may be deposited or formed by a process which is different from that which is used to deposit or form conductor 318 which overlies inorganic insulator 314.

Conclusion

Embodiments of the present invention provide high density, low capacitance interconnections on integrated circuits.

An advantage of embodiments of the present invention is the cost-effective achievement low parasitic capacitance and high packing density by forming unlanded vias through a hybrid insulator system.

The present invention may be implemented with various changes and substitutions to the illustrated embodiments. For example, the present invention may be implemented in on a sapphire substrate rather than an insulating layer formed on a silicon wafer. Additionally, illustrative embodiments describe vias between two levels of interconnect, however those skilled in the art will recognize that many interconnect levels may be connected means of unlanded vias in accordance with the present invention.

It will be readily understood by those skilled in the art that various other changes in the details, materials, and arrangements of the parts and steps which have been described and illustrated in order to explain the nature of this invention may be made without departing from the principles and scope of the invention as expressed in the subjoined claims.

What is claimed is:

1. A method of forming an unlanded via opening, wherein at least two spaced apart conductors have a low dielectric constant material disposed therebetween and a superjacent inter-layer dielectric (ILD), the method comprising:

forming a resist pattern;

etching the ILD;

concurrently stripping the resist and anisotropically etching the low dielectric constant material.

2. The method of claim 1, wherein the ILD comprises an oxide of silicon.

3. The method of claim 1, wherein the ILD comprises a nitride of silicon.

4. The method of claim 1, wherein the low dielectric constant material is an organic polymer.

5. The method of claim 1, wherein the low dielectric constant material is a silicon based insulator containing an organic polymer.

6. The method of claim 1, wherein stripping the resist and anisotropically etching the low dielectric constant material comprise exposing the resist and the low dielectric constant material to an oxygen containing plasma.

7. A method of forming an unlanded via comprising:

a) depositing a conductive material on an insulating substrate;

b) patterning the conductive material with a first pattern;

c) disposing an intra-layer low dielectric constant material between the patterned conductive material;

d) depositing an interlayer dielectric (ILD);

e) forming an unlanded via opening resist pattern;

f) etching the ILD;

g) concurrently stripping the unlanded via opening resist and anisotropically etching the intra-layer low dielectric constant material; and h) substantially filling the unlanded via opening with an electrically conductive material.

8. The method of claim 7, wherein the conductive material comprises metal.

9. The method of claim 7, wherein the intra-layer low dielectric constant material comprises an organic polymer.

10. The method of claim 7, wherein the intra-layer low dielectric constant material comprises a silicon based insulator containing an organic polymer.

11. The method of claim 7, wherein the ILD comprises an oxide of silicon.

12. The method of claim 7, wherein the ILD comprises a fluorine doped oxide of silicon.

13. The method of claim 7, wherein stripping the resist and anisotropically etching the low dielectric constant material comprise exposing the resist and the low dielectric constant material to an oxygen containing plasma.

* * * * *